United States Patent
Yamashima et al.

(10) Patent No.: US 10,316,835 B2
(45) Date of Patent: Jun. 11, 2019

(54) METHOD OF DETERMINING OUTPUT FLOW RATE OF GAS OUTPUT BY FLOW RATE CONTROLLER OF SUBSTRATE PROCESSING APPARATUS

(71) Applicant: TOKYO ELECTRON LIMITED, Tokyo (JP)

(72) Inventors: Jun Yamashima, Miyagi (JP); Shinichiro Hayasaka, Miyagi (JP); Toshihiro Tsuruta, Miyagi (JP); Hiroshi Fujii, Miyagi (JP); Junichi Akiba, Miyagi (JP); Naoya Jami, Miyagi (JP); Naotsugu Hoshi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/782,168

(22) Filed: Oct. 12, 2017

(65) Prior Publication Data
US 2018/0106247 A1  Apr. 19, 2018

(30) Foreign Application Priority Data
Oct. 14, 2016 (JP) .................... 2016-202567

(51) Int. Cl.
*F04B 49/06* (2006.01)
*F04B 49/08* (2006.01)
(Continued)

(52) U.S. Cl.
CPC ............ *F04B 49/065* (2013.01); *F04B 41/02* (2013.01); *F04B 49/08* (2013.01); *G05D 7/0623* (2013.01);
(Continued)

(58) Field of Classification Search
CPC ........ B81C 1/00531; B81C 2201/0105; B81C 2201/0132; C04B 41/5346; F04B 49/08;
(Continued)

(56) References Cited

U.S. PATENT DOCUMENTS

2010/0125424 A1* 5/2010 Ding .................. G01F 25/0053
702/47
2013/0092243 A1* 4/2013 Mohammed ........ G01F 25/0053
137/2

FOREIGN PATENT DOCUMENTS

JP          2002-296096 A   10/2002
JP          5538119 B2       7/2014

* cited by examiner

*Primary Examiner* — Duy Vu N Deo
(74) *Attorney, Agent, or Firm* — Studebaker & Brackett PC

(57) ABSTRACT

In a method of an embodiment, a pressure sensor is selected from first and second pressure sensors according to a set flow rate. A measurable maximum pressure of the second pressure sensor is higher than a measurable maximum pressure of first pressure sensor. The target pressure of a chamber is determined according to the set flow rate. Until the pressure of the chamber reaches the target pressure after gas is started to be output from the flow rate controller to the chamber at an output flow rate according to the set flow rate and a pressure controller provided between the chamber and an exhaust apparatus is closed, the pressure of the chamber is measured by the selected pressure sensor. The output flow rate of the flow rate controller is determined from a rate of rise of the pressure of the chamber.

6 Claims, 5 Drawing Sheets

(51) Int. Cl.
    *G05D 7/06*          (2006.01)
    *F04B 41/02*        (2006.01)
    *B81C 1/00*         (2006.01)
    *C04B 41/53*       (2006.01)

(52) U.S. Cl.
    CPC ...... *B81C 1/00531* (2013.01); *C04B 41/5346* (2013.01); *F04B 2205/063* (2013.01); *F04B 2205/09* (2013.01)

(58) Field of Classification Search
    CPC .................. F04B 41/02; F04B 2205/09; F04B 2205/063; G05D 7/0623
    See application file for complete search history.

METHOD OF DETERMINING OUTPUT FLOW RATE OF GAS OUTPUT BY FLOW RATE CONTROLLER OF SUBSTRATE PROCESSING APPARATUS

CROSS-REFERENCE TO RELATED APPLICATIONS

This application is based on and claims the benefit of priority from Japanese Patent Application No. 2016-202567 filed on Oct. 14, 2016, the entire contents of which are incorporated herein by reference.

FIELD

Exemplary embodiments of the present disclosure relate to a method of determining an output flow rate of gas which is output by a flow rate controller of a substrate processing apparatus.

BACKGROUND

Substrate processing apparatuses are used in the manufacturing of electronic devices such as a semiconductor device. In substrate processing using the substrate processing apparatus, generally, a substrate is disposed within a chamber, and gas is supplied to the chamber. The flow rate of gas supplied to the chamber is controlled by a flow rate controller. The flow rate controller controls the output flow rate of gas in accordance with a set flow rate which is specified.

The flow rate of gas supplied to the chamber is an important factor having an influence on process results of substrate processing. Therefore, the output flow rate of the flow rate controller has to be calibrated in a timely manner. For that reason, it is necessary to determining the output flow rate of the flow rate controller. As a method of determining the output flow rate of the flow rate controller, a so-called build-up method is known. The build-up method is described in Japanese Patent Application Laid-Open Publication No. 2002-296096 and Japanese Patent No. 5538119.

In the build-up method, gas is output from the flow rate controller at an output flow rate in accordance with a set flow rate, and the gas is supplied to the internal space of a tank having a known volume. During the supply of gas into the tank, a measurement value of the pressure of the internal space is obtained by a pressure sensor. The rate of rise of the pressure of the internal space with respect to a time is determined by the obtained measurement value, and the output flow rate is determined using the rate of rise of the pressure. As the tank used in the build-up method, the chamber body of the substrate processing apparatus may be used, or a tank dedicated to the build-up method may be used.

SUMMARY

In one aspect, there is provided a method of determining an output flow rate of gas which is output by a flow rate controller of a substrate processing apparatus. The substrate processing apparatus includes a chamber body, a flow rate controller, a pressure controller, an exhaust apparatus, a first pressure sensor, and a second pressure sensor. The chamber body provides an internal space thereof as a chamber. The flow rate controller is configured to control the output flow rate of gas to be supplied to the chamber in accordance with a set flow rate to be specified. The pressure controller is connected to the chamber. The exhaust apparatus is connected to the chamber through the pressure controller. The first pressure sensor is a sensor configured to measure a pressure of the chamber. The second pressure sensor is a sensor configured to measure a pressure of the chamber, and is capable of measuring a maximum pressure higher than a maximum pressure capable of being measured by the first pressure sensor.

The method according to the one aspect includes (i) a step of selecting a pressure sensor from the first pressure sensor and the second pressure sensor in accordance with a set flow rate specified to the flow rate controller, wherein the first pressure sensor is selected in a case where the set flow rate is less than a threshold, and the second pressure sensor is selected in a case where the set flow rate is not less than the threshold; (ii) a step of determining a target pressure to be reached by the pressure of the chamber in accordance with the set flow rate, wherein the target pressure is determined so as to increase in proportion to a magnitude of the set flow rate or increase stepwise in accordance with the magnitude of the set flow rate; (iii) a step of starting to introduce gas at a flow rate according to the set flow rate from the flow rate controller to the chamber; (iv) a step of closing the pressure controller; and (v) a step of calculating an output flow rate of the flow rate controller, using a rate of rise of the pressure of the chamber with respect to a time which is derived from a measurement value of the pressure of the chamber measured by the selected pressure sensor, in a period from a time point at which the pressure controller was closed to a time point at which the pressure of the chamber reached the target pressure.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DESCRIPTION OF THE PREFERRED EMBODIMENTS

Figure 1:
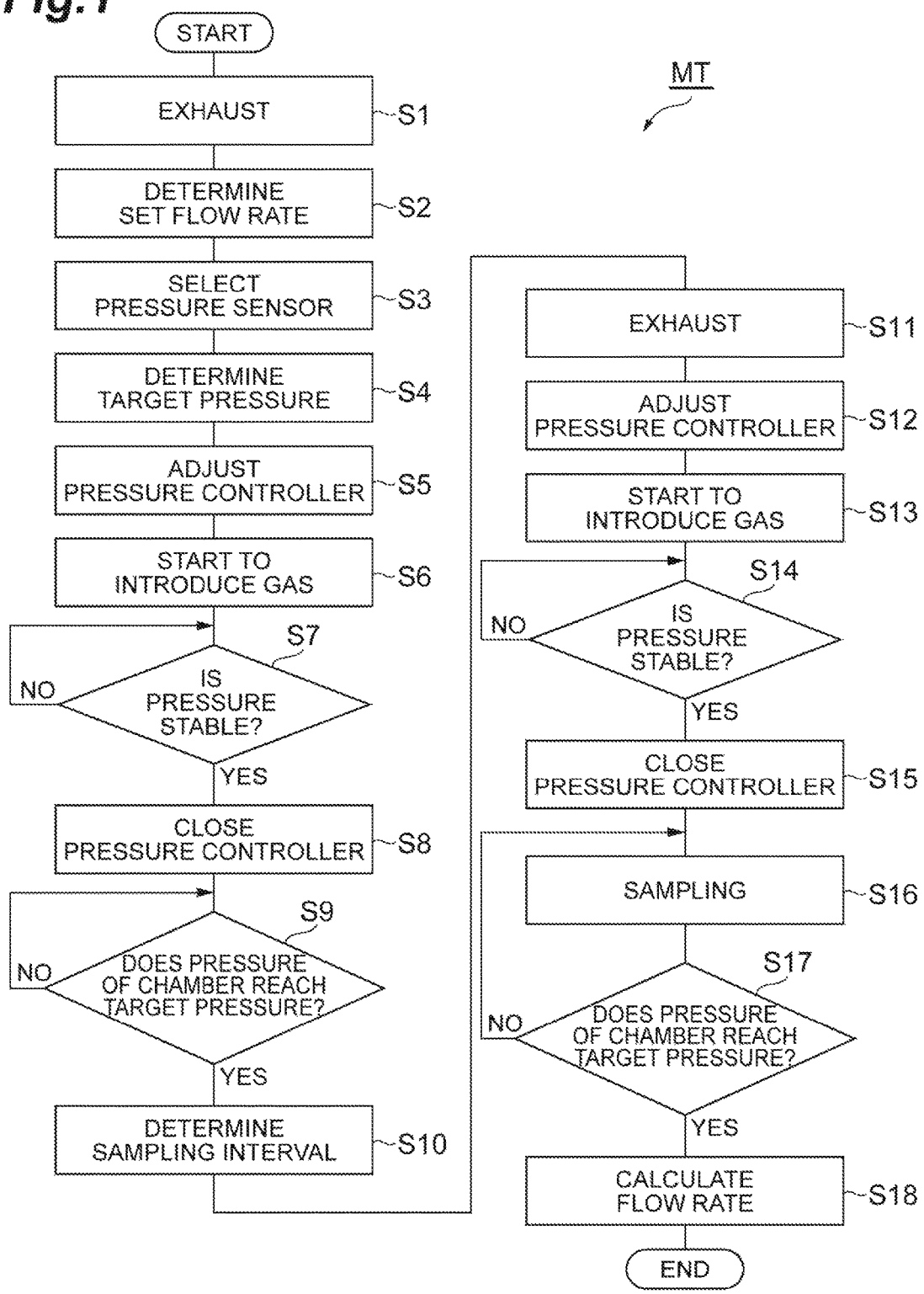
FIG. 1 is a flow diagram illustrating a method of determining an output flow rate of gas which is output by a flow rate controller of a substrate processing apparatus according to an exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

In the build-up method, it is necessary to determining the rate of rise of pressure. Therefore, in order to determining the output flow rate of the flow rate controller with a high degree of accuracy, a sufficient length of time is required to be secured as the length of time of a period during which the pressure rises from an initial pressure to a final pressure. However, in a case where the flow rate controller outputs gas to the chamber at a large flow rate, the pressure of the chamber rises drastically, and thus a sufficient length of time cannot be secured as the length of time of the period during which the pressure rises from the initial pressure to the final pressure. Accordingly, in a case where the flow rate controller outputs gas to the chamber at a large flow rate, the output flow rate cannot be determined with a high degree of accuracy. Hence, even in a case where the flow rate controller outputs gas to the chamber at a large flow rate, it is required that the output flow rate of the flow rate controller is determined with a high degree of accuracy.

In one aspect, there is provided a method of determining an output flow rate of gas which is output by a flow rate controller of a substrate processing apparatus. The substrate processing apparatus includes a chamber body, a flow rate controller, a pressure controller, an exhaust apparatus, a first pressure sensor, and a second pressure sensor. The chamber body provides an internal space thereof as a chamber. The flow rate controller is configured to control the output flow rate of gas to be supplied to the chamber in accordance with a set flow rate to be specified. The pressure controller is connected to the chamber. The exhaust apparatus is connected to the chamber through the pressure controller. The first pressure sensor is a sensor configured to measure a pressure of the chamber. The second pressure sensor is a sensor configured to measure a pressure of the chamber, and is capable of measuring a maximum pressure higher than a maximum pressure capable of being measured by the first pressure sensor.

The method according to the one aspect includes (i) a step of selecting a pressure sensor from the first pressure sensor and the second pressure sensor in accordance with a set flow rate specified to the flow rate controller, wherein the first pressure sensor is selected in a case where the set flow rate is less than a threshold, and the second pressure sensor is selected in a case where the set flow rate is not less than the threshold; (ii) a step of determining a target pressure to be reached by the pressure of the chamber in accordance with the set flow rate, wherein the target pressure is determined so as to increase in proportion to a magnitude of the set flow rate or increase stepwise in accordance with the magnitude of the set flow rate; (iii) a step of starting to introduce gas at a flow rate according to the set flow rate from the flow rate controller to the chamber; (iv) a step of closing the pressure controller; and (v) a step of calculating an output flow rate of the flow rate controller, using a rate of rise of the pressure of the chamber with respect to a time which is derived from a measurement value of the pressure of the chamber measured by the selected pressure sensor, in a period from a time point at which the pressure controller was closed to a time point at which the pressure of the chamber reached the target pressure.

The method according to the one aspect uses the second pressure sensor capable of measuring a relatively large maximum pressure in addition to the first pressure sensor. In this method, in a case where a set flow rate to be specified to the flow rate controller is larger than the threshold, the second pressure sensor is selected, and the target pressure to be reached by the pressure of the chamber is set to a large pressure. Therefore, a sufficient length of time is secured as the length of time of a period during which the pressure of the chamber rises to the target pressure from an initial pressure at a time point at which the pressure controller was closed. Hence, even in a case where the flow rate controller outputs a large flow rate of gas to the chamber, it is possible to determine a rate of rise of the pressure of the chamber with respect to a time with a high degree of accuracy, and to determine the output flow rate of the flow rate controller with a high degree of accuracy.

In an embodiment, the target pressure is determined by referring to a table using the set flow rate, the table specifying in advance a relationship between flow rates and target pressures so that the period has a length of time not less than a predetermined length of time.

In an embodiment, the method further includes a step of determining a sampling interval so that a plurality of and a predetermined number of measurement values of the pressure of the chamber are obtained in the period. The rate of rise of the pressure is derived from a plurality of measurement values of the pressure of the chamber measured by the selected pressure sensor at the sampling interval in the period.

In an embodiment, a flow passage length Lb between one of the first pressure sensor and the second pressure sensor and the chamber, and a flow passage length Ls between the other of the first pressure sensor and the second pressure sensor and the chamber satisfy relations of Lb≥Ls and 0.54≤Ls/Lb≤1. According to this embodiment, a difference between the measurement value of the pressure of the chamber of the first pressure sensor and the measurement value of the pressure of the chamber of the second pressure sensor become sufficiently small. The length Lb may be not more than 234.8 mm.

In an embodiment, the maximum pressure capable of being measured by the second pressure sensor is not less than 1,000 Torr (133,300 Pa).

Hereinafter, various embodiments will be described in detail with reference to the accompanying drawings. In the drawings, the same or equivalent portions are denoted by the same reference symbols.

FIG. 1 is a flow diagram illustrating a method of determining an output flow rate of gas which is output by a flow rate controller of a substrate processing apparatus according to an exemplary embodiment. A method MT shown in FIG. 1 is a method of determining an output flow rate of a flow rate controller of a substrate processing apparatus using a so-called build-up method. The substrate processing apparatus may be an arbitrary substrate processing apparatus. The substrate processing apparatus may be, for example, a plasma processing apparatus.

Figure 2:
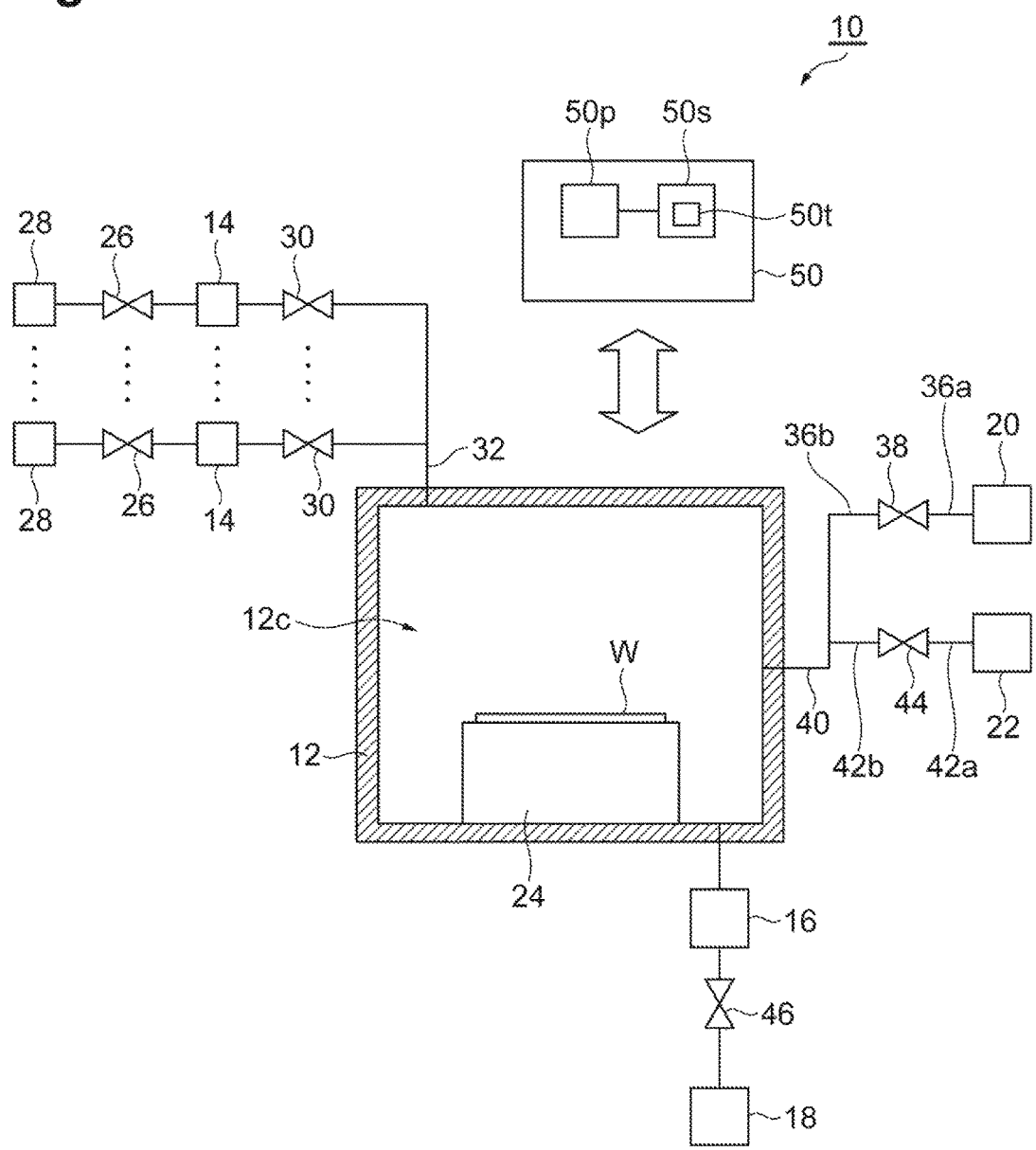
FIG. 2 is a diagram schematically illustrating an example of a substrate processing apparatus to which the method shown in FIG. 1 can be applied.

FIG. 2 is a diagram schematically illustrating an example of a substrate processing apparatus to which the method shown in FIG. 1 can be applied. A substrate processing apparatus 10 shown in FIG. 2 includes a chamber body 12, a plurality of flow rate controllers 14, a pressure controller 16, an exhaust apparatus 18, a first pressure sensor 20, and a second pressure sensor 22.

The chamber body 12 is a container, and provides the internal space thereof as a chamber 12c. A stage 24 is provided within the chamber 12c. The stage 24 is configured to support a substrate W which is disposed within the chamber 12c.

Each of the plurality of flow rate controllers 14 is an apparatus that adjusts the output flow rate of gas to be supplied to the chamber 12c, in accordance with a set flow rate to be specified. Each of the plurality of flow rate controllers 14 may be a mass flow controller or a pressure control-type flow rate controller. It should be noted that the number of flow rate controllers 14 included in the substrate processing apparatus 10 may be an arbitrary number equal to or greater than one.

A primary valve 26 is provided on the upstream side (primary side) of each of the plurality of flow rate controllers 14. Each of the plurality of flow rate controllers 14 is connected to a gas source 28 through the primary valve 26. The gas source 28 is a source of gas for substrate processing. A secondary valve 30 is provided on the downstream side (secondary side) of each of the plurality of flow rate controllers 14. Each of the plurality of flow rate controllers 14 is connected to the chamber 12c through the secondary valve 30 and a pipe 32.

The first pressure sensor 20 and the second pressure sensor 22 are sensors that measure the pressure of the chamber 12c and output a measurement value of the pressure. Each of the first pressure sensor 20 and the second pressure sensor 22 may be, for example, a capacitance manometer. The second pressure sensor 22 is capable of measuring a maximum pressure higher than a maximum pressure capable of being measured by the first pressure sensor 20. The maximum pressure capable of being measured by the first pressure sensor 20 is, for example, 1,333 Pa (10 Torr), and the maximum pressure capable of being measured by the second pressure sensor 22 is, for example, not less than 133,300 Pa (1,000 Torr).

One end of a pipe 36a is connected to the first pressure sensor 20. The other end of the pipe 36a is connected to a valve 38. The valve 38 is, for example, a two-way valve. One end of a pipe 36b is connected to the valve 38. The other end of the pipe 36b is connected to a pipe 40. One end of a pipe 42a is connected to the second pressure sensor 22. The other end of the pipe 42a is connected to a valve 44. The valve 44 is, for example, a two-way valve. One end of a pipe 42b is connected to the valve 44. The other end of the pipe 42b is connected to the pipe 40. The pipe 40 is connected to the chamber 12c. Therefore, a portion of the gas supplied to the chamber 12c can reach the first pressure sensor 20 and the second pressure sensor 22.

The pressure controller 16 is connected to the chamber 12c. The pressure controller 16 is, for example, an automatic pressure controller, and has a pressure control valve. A valve 46 is provided on the downstream side of the pressure controller 16. The pressure controller 16 is connected to the exhaust apparatus 18 through the valve 46. The exhaust apparatus 18 may include one or more exhaust apparatuses such as a dry pump or a turbo-molecular pump.

In an embodiment, the substrate processing apparatus 10 may further include a controller 50. The controller 50 is configured to control of each portion of the substrate processing apparatus 10 in substrate processing and the execution of the method MT described later. The controller 50 may be a computer device, and may include a processor 50p, a storage device 50s such as a memory, an input device such as a keyboard, and the like. A control program executed by a processor in substrate processing, and recipe data for substrate processing are stored in the storage device 50s. In addition, a program for the execution of the method MT, and data used in the method MT are stored in the storage device 50s.

Hereinafter, the method MT will be described by taking an example of a case where the output flow rate of one flow rate controller 14 of the substrate processing apparatus 10 is determined. The method MT may be automatically executed by the controller 50 controlling each portion of the substrate processing apparatus 10.

Figure 3:
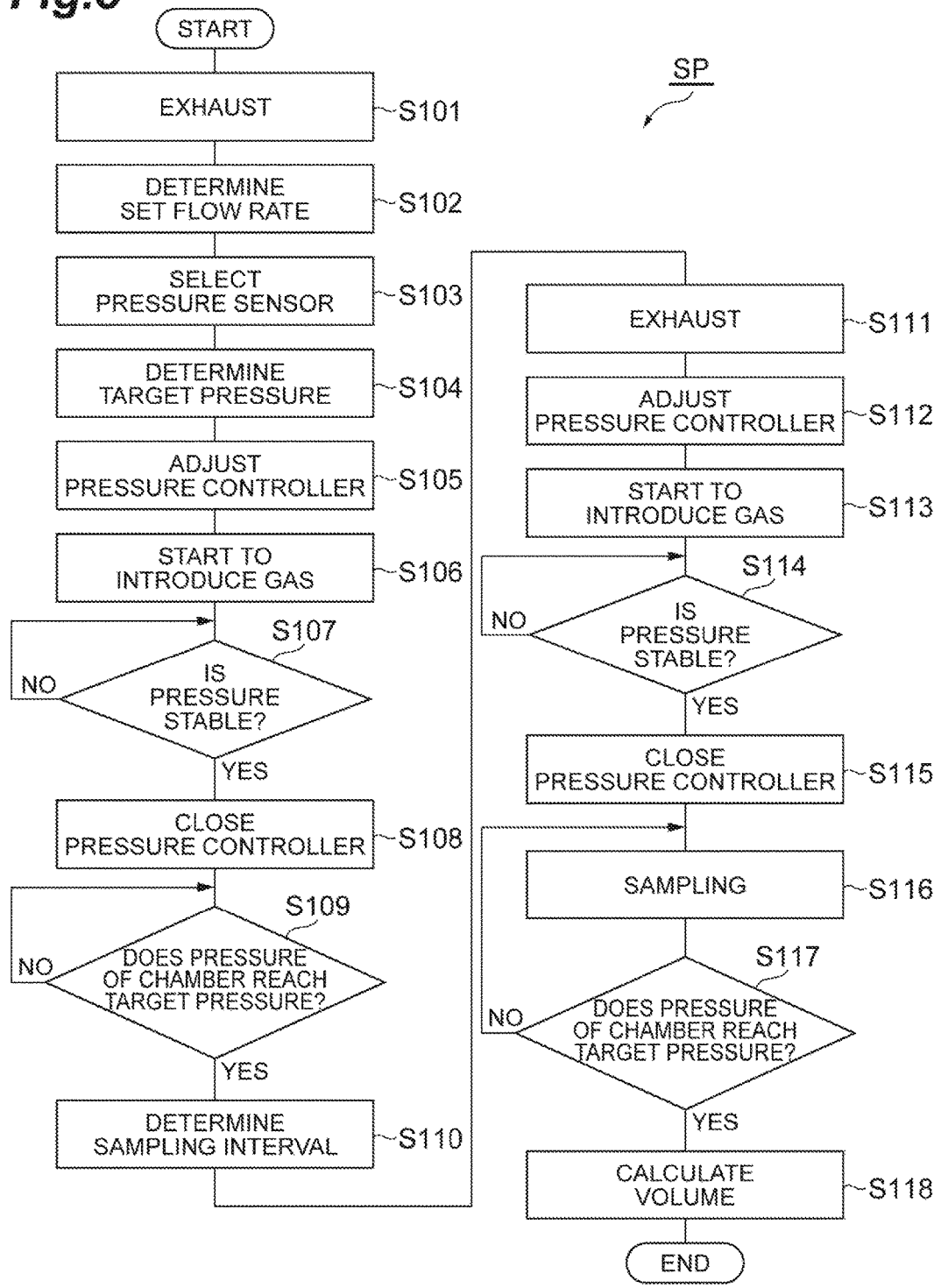
FIG. 3 is a flow diagram illustrating an example of a process of determining a volume of a chamber.

In the method MT, the volume of the chamber 12c is used in the calculation of the output flow rate of the flow rate controller 14. The volume of the chamber 12c may be a known volume determined in advance. In the method MT, the volume of the chamber 12c may be determined before the execution of a first step shown in FIG. 1. Hereinafter, a process of determining a volume of the chamber 12c will be described with reference to FIG. 3. FIG. 3 is a flow diagram illustrating an example of a process of determining a volume of a chamber.

A process SP shown in FIG. 3 may be automatically executed by the controller 50 controlling each portion of the substrate processing apparatus 10. The process SP shown in FIG. 3 starts with step S101. In step S101, the exhaust of the chamber 12c is performed. Specifically, in step S101, the valve 38, the valve 44, the valve 46, and the pressure control valve of the pressure controller 16 are opened, the exhaust apparatus 18 is brought into operation. In addition, in step S101, the primary valve 26 is closed. In step S101, the secondary valve 30 may be closed or opened.

Subsequently, in step S102, a set flow rate to be specified to the flow rate controller 14 is determined. The set flow rate is determined by, for example, an operator, and is input to the controller 50. The set flow rate determined in step S102 is the same as a set flow rate determined in step S2 of the method MT described later.

Subsequently, in step S103, the selection of a pressure sensor is performed. Specifically, in step S103, the first pressure sensor 20 or the second pressure sensor 22 is selected in accordance with the result of comparison between the set flow rate and a threshold. Since the selection of a pressure sensor in step S103 is performed in the same manner as the selection of a pressure sensor in step S3 of the method MT described later, later description relating to step S3 is referred to with regard to the details thereof.

Subsequently, in step S104, a target pressure to be reached by the pressure of the chamber 12c is determined. In step S104, the target pressure is determined in accordance with the set flow rate determined in step S102. Since the determination of the target pressure in step S104 is performed in the same manner as the determination of a target pressure in step S4 of the method MT described later, later description relating to step S4 is referred to with regard to the details thereof.

Subsequently, in step S105, the adjustment of the pressure controller 16 is performed. Specifically, the degree of opening of the pressure control valve of the pressure controller 16 is adjusted so that the pressure of the chamber 12c will become a predetermined pressure after the introduction of gas to the chamber 12c is started in step S106 described later.

Subsequently, in step S106, the introduction of gas into the chamber 12c is started. Specifically, in step S106, the primary valve 26 provided upstream of one flow rate controller 14 and the secondary valve 30 provided on the downstream side of the flow rate controller 14 are opened, and the flow rate controller 14 starts to output gas at an output flow rate according to the set flow rate. The primary valve 26 provided upstream of another flow rate controller 14 and the secondary valve 30 provided on the downstream side of the other flow rate controller 14 are closed.

Subsequently, in step S107, it is determined whether the pressure of the chamber 12c is stable at a predetermined pressure. In step S107, for example, when a predetermined time has elapsed after the start of the introduction of gas in step S106, it is determined that the pressure of the chamber 12c is stable. Alternatively, in step S107, the amount of fluctuation in the pressure of the chamber 12c with respect to a predetermined pressure is obtained from measurement values of the pressure of the chamber 12c acquired by the first pressure sensor 20 or the second pressure sensor 22, and it is determined that the pressure of the chamber 12c is stable in a case where the amount of fluctuation is smaller than a predetermined value. In a case where it is determined in step S107 that the pressure of the chamber 12c is not stable, the determination of step S107 is repeated again until the pressure of the chamber 12c becomes stable. On the other hand, in a case where it is determined in step S107 that the pressure of the chamber 12c is stable, the process proceeds to step S108.

In step S108, the pressure control valve of the pressure controller 16 is closed. Subsequently, in step S109, it is determined whether the pressure of the chamber 12c reaches the target pressure. Specifically, it is determined whether the measurement value of the pressure of the chamber 12c acquired by a pressure sensor selected in step S103 reaches the target pressure. In a case where it is determined in step S109 that the pressure of the chamber 12c does not reach the target pressure, the determination of step S109 is repeated again until the pressure of the chamber 12c reaches the target pressure. On the other hand, in a case where it is determined in step S109 that the pressure of the chamber 12c reaches the target pressure, the process proceeds to step S110.

In step S110, a sampling interval is determined. Specifically, in step S110, a sampling interval is determined so that a plurality of and a predetermined number of sampled values (measurement values of the pressure of the chamber 12c) are obtained in a period from a time point at which the pressure control valve of the pressure controller 16 was closed to a time point at which the pressure of the chamber 12c reached the target pressure. For example, a sampling interval is determined so that ten sampled values are obtained in the period.

Subsequently, in step S111, the exhaust of the chamber 12c is performed. Step S111 is the same step as step S101. Subsequently, in step S112, the adjustment of the pressure controller 16 is performed. In step S112, the degree of opening of the pressure control valve of the pressure controller 16 is adjusted so that the pressure of the chamber 12c will become a predetermined pressure after the introduction of gas into the chamber 12c is started in step S113 described later.

Subsequently, in step S113, the introduction of gas to the chamber 12c is started. Step S113 is the same step as step S106, and gas is started to be output at an output flow rate according to the set flow rate from one flow rate controller 14. Subsequently, in step S114, it is determined whether the pressure of the chamber 12c is stable at a predetermined pressure. Step S114 is the same step as step S107. Subsequently, in step S115, the pressure control valve of the pressure controller 16 is closed. Step S115 is the same step as step S108.

Subsequently, in step S116, the acquisition of a measurement value of the pressure of the chamber 12c by a pressure sensor selected in step S103, that is, the sampling of the pressure of the chamber 12c is performed at the sampling interval determined in step S110.

Subsequently, in step S117, it is determined whether the measurement value of the pressure acquired in step S116 reaches the target pressure. In a case where it is determined in step S117 that the pressure of the chamber 12c does not reach the target pressure, the sampling of step S116 is repeated. On the other hand, in a case where it is determined in step S117 that the pressure of the chamber 12c reaches the target pressure, the process proceeds to step S118.

In step S118, the volume V of the chamber 12c is calculated. The volume V of the chamber 12c is calculated by the following Expression (1).

$$V = KQ/(\Delta P/\Delta t) \qquad (1)$$

Expression (1) is an expression which is derived from the equation of state of gas. In Expression (1), Q is a set flow rate specified to the flow rate controller 14. In Expression (1), $\Delta P/\Delta t$ is a rate of rise of the pressure of the chamber 12c with respect to a time. $\Delta P/\Delta t$ is determined from a plurality of measurement values of the pressure of the chamber 12c acquired by the repetition of step S116 and a plurality of time points at which the plurality of measurement values were respectively obtained. For example, in an orthogonal biaxial coordinate system having a time axis and a pressure axis, a straight line is fitted with respect to a plurality of pieces of data each of which includes one time point out of the plurality of time points and a measurement value acquired at the one time point among the plurality of measurement values, and thus the inclination of the straight line can be determined as $\Delta P/\Delta t$. In addition, in Expression (1), K is defined by the following Expression (2).

$$K = RT/(22.4 \times 10^3) \qquad (2)$$

In Expression (2), R is a gas constant, and is 62.36 (Torr·l·mol$^{-1}$·K$^{-1}$). In addition, T is the temperature of gas in the chamber 12c, and may be measured by a temperature sensor connected to the chamber 12c, or may be a constant temperature (for example, 22° C.). In a case where T is 22° C., K is 0.82 (Torr).

Hereinafter, reference is made to FIG. 1 again to describe the method MT. In the method MT, as shown in FIG. 1, step S1 is executed. Step S1 is the same step as step S101 of the process SP. Subsequently, in step S2, a set flow rate to be specified to the flow rate controller 14 is determined. The set flow rate which is determined in step S2 is the same set flow rate as the set flow rate determined in step S102 of the process SP. In an embodiment, the set flow rate which is input to the controller 50 by an operator in step S102 is also used in step S2.

Subsequently, in step S3, the selection of a pressure sensor is performed. Specifically, in step S3, the first pressure sensor 20 or the second pressure sensor is selected in accordance with the result of comparison between the set flow rate and the threshold. In a case where the set flow rate is less than the threshold, the first pressure sensor 20 is selected. On the other hand, in a case where the set flow rate is not less than the threshold, the second pressure sensor 22 is selected. The threshold is, for example 1,000 sccm.

Subsequently, in step S4, a target pressure to be reached by the pressure of the chamber 12c is determined. In step S4, the target pressure is determined in accordance with the set flow rate determined in step S2. The target pressure is set so as to increase in proportion to the magnitude of the set flow rate to be specified or increase stepwise in accordance with the magnitude of the set flow rate. For example, the set flow rate is input by the controller 50 to a function of outputting a target pressure increasing in proportion to a flow rate or increasing stepwise in accordance with the magnitude of the flow rate to determine the target pressure. Alternatively, a table 50t specifying in advance a relationship between flow rates and target pressures is referred to using the set flow rate by the controller 50 to determine the target pressure. This table 50t is stored in the storage device 50s of the controller 50. This table specifies in advance a relationship between flow rates and target pressures so that a period from a time point at which the pressure control valve of the pressure controller 16 is closed in step S15 described later to a time point at which the pressure of the chamber 12c reaches the target pressure has a length of time not less than a predetermined length of time. The predetermined length of time may be a length of time not less than 20 seconds.

Subsequent step S5 is the same step as step S105 of the process SP. In step S5, the adjustment of the pressure controller 16 is performed. Specifically, the degree of opening of the pressure control valve of the pressure controller 16 is adjusted so that the pressure of the chamber 12c will become a predetermined pressure after the introduction of gas into the chamber 12c is started in step S6 described later.

Subsequent step S6 is the same step as step S106 of the process SR. In step S6, the introduction of gas to the chamber 12c is started. Specifically, in step S6, the primary valve 26 provided upstream of one flow rate controller 14 and the secondary valve 30 provided on the downstream side of the flow rate controller 14 are opened, and the flow rate controller 14 starts to output gas at an output flow rate according to the set flow rate. The primary valve 26 provided upstream of another flow rate controller 14 and the secondary valve 30 provided on the downstream side of the other flow rate controller 14 are closed.

Subsequent step S7 is the same step as step S107 of the process SP. In step S7, it is determined whether the pressure of the chamber 12c is stable at a predetermined pressure. In step S7, for example, it is determined that the pressure of the chamber 12c is stable when a predetermined time has elapsed after the start of the introduction of gas in step S6. Alternatively, in step S7, the amount of fluctuation in the pressure of the chamber 12c with respect to a predetermined pressure is determined from measurement values of the pressure of the chamber 12c obtained by the first pressure sensor 20 or the second pressure sensor 22, and it is determined that the pressure of the chamber 12c is stable in a case where the amount of fluctuation is smaller than a predetermined value. In a case where it is determined that the pressure of the chamber 12c is not stable in step S7, the determination of step S7 is repeated again until the pressure of the chamber 12c becomes stable. On the other hand, in a case where it is determined in step S7 that the pressure of the chamber 12c is stable, the process proceeds to step S8.

Step S8 is the same step as step S108 of the process SP. In step S8, the pressure control valve of the pressure controller 16 is closed. Subsequent step S9 is the same step as step S109 of the process SP. In step S9, it is determined whether the pressure of the chamber 12c reaches the target pressure. Specifically, it is determined whether the measurement value of the pressure of the chamber 12c obtained by a pressure sensor selected in step S3 reaches the target pressure. In a case where it is determined in step S9 that the pressure of the chamber 12c does not reach the target pressure, the determination of step S9 is repeated again until the pressure of the chamber 12c reaches the target pressure. On the other hand, in a case where it is determined in step S9 that the pressure of the chamber 12c reaches the target pressure, the process proceeds to step S10.

Step S10 is the same step as step S110 of the process SP. In step S10, a sampling interval is determined. Specifically, in step S10, a sampling interval is determined so that a plurality of and a predetermined number of sampled values (measurement values of the pressure of the chamber 12c) are obtained in a period from a time point at which the pressure control valve of the pressure controller 16 was closed to a time point at which the pressure of the chamber 12c reached the target pressure. For example, a sampling interval is determined so that ten sampled values are obtained in the period.

Subsequent step S11 is the same step as step S1. In step S11, the exhaust of the chamber 12c is performed. Subsequent step S12 is the same step as step S5. In step S12, the adjustment of the pressure controller 16 is performed. In step S12, the degree of opening of the pressure control valve of the pressure controller 16 is adjusted so that the pressure of the chamber 12c will become a predetermined pressure after the introduction of gas into the chamber 12c is started in step S13 described later.

Subsequent step S13 is the same step as step S6. In step S6, the introduction of gas into the chamber 12c is started. Specifically, in step S13, gas is started to be output at an output flow rate according to the set flow rate from one flow rate controller 14. Subsequent step S14 is the same step as step S7. In step S14, it is determined whether the pressure of the chamber 12c is stable at a predetermined pressure. Subsequent step S15 is the same step as step S8. In step S15, the pressure control valve of the pressure controller 16 is closed.

Subsequently, in step S16, the acquisition of a measurement value of the pressure of the chamber 12c by the pressure sensor selected in step S3, that is, the sampling of the pressure of the chamber 12c is performed at the sampling interval determined in step S10.

Subsequently, in step S17, it is determined whether the measurement value of the pressure obtained in step S16 reaches the target pressure. In a case where it is determined in step S17 that the pressure of the chamber 12c does not reach the target pressure, the sampling of step S16 is repeated. On the other hand, in a case where it is determined in step S17 that the pressure of the chamber 12c reaches the target pressure, the process proceeds to step S18.

In step S18, the output flow rate Q of the flow rate controller 14 is calculated. The output flow rate Q of the flow rate controller 14 is calculated by the following Expression (3).

$$Q = V/K \times (\Delta P/\Delta t) \qquad (3)$$

Expression (3) is an expression which is derived from the equation of state of gas. In Expression (3), V is a known volume of the chamber 12c. The volume V may be a volume determined by the process SP. In Expression (1), $\Delta P/\Delta t$ is a rate of rise of the pressure of the chamber 12c with respect to a time. $\Delta P/\Delta t$ is determined from a plurality of measurement values of the pressure of the chamber 12c acquired by the repetition of step S16 and a plurality of time points at which the plurality of measurement values were respectively obtained. For example, in an orthogonal biaxial coordinate system having a time axis and a pressure axis, a straight line is fitted with respect to a plurality of pieces of data each of which includes one time point out of the plurality of time points and a measurement value obtained at the one time point among the plurality of measurement values, and thus the inclination of the straight line can be determined as $\Delta P/\Delta t$. In addition, in Expression (3), K is defined by Expression (2). In Expression (2), T may be measured by a temperature sensor connected to the chamber 12c, or may be a constant temperature (for example, 22° C.). In a case where T is 22° C., K is 0.82 (Torr).

In the method MT, the second pressure sensor 22 capable of measuring a relatively large maximum pressure is used in addition to the first pressure sensor 20. In this method, in a case where a set flow rate to be specified to the flow rate controller 14 is larger than the threshold, the second pressure sensor 22 is selected, and a target pressure to be reached by the pressure of the chamber 12c is set to a large pressure. Therefore, a sufficient length of time is secured as the length of time of a period during which the pressure of the chamber 12c rises to the target pressure from an initial pressure at a time point at which the pressure control valve of the pressure controller 16 was closed. Hence, even in a case where the flow rate controller 14 outputs a large flow rate of gas to the chamber, it is possible to determine a rate of rise of the pressure of the chamber with respect to a time with a high degree of accuracy, and to determine the output flow rate of the flow rate controller 14 with a high degree of accuracy.

Hereinafter, a description will be given of results of two simulations relating to a relationship between the length of time for which gas is filled into a chamber and the attainment pressure of the chamber.

Figure 4:
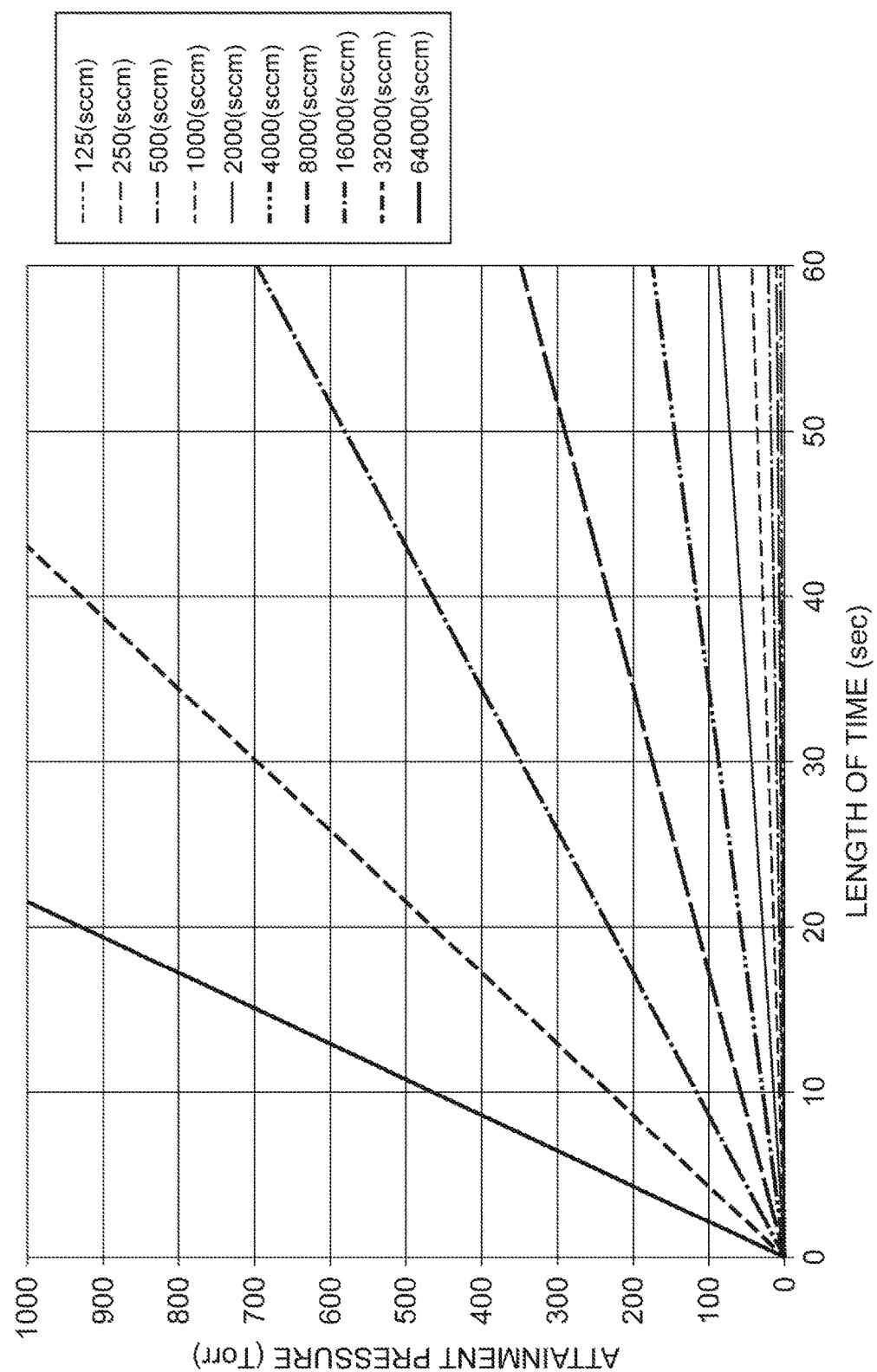
FIG. 4 is a graph illustrating results of a first simulation.

In a first simulation, the length of time for which gas is filled into a chamber having a volume of 20 liters and the attainment pressure of the chamber are determined using the flow rate of gas as parameters. FIG. 4 is a graph illustrating results of the first simulation. The horizontal axis of the graph of FIG. 4 is the length of time for which gas is filled, and the vertical axis is the attainment pressure of the chamber.

Figure 5:
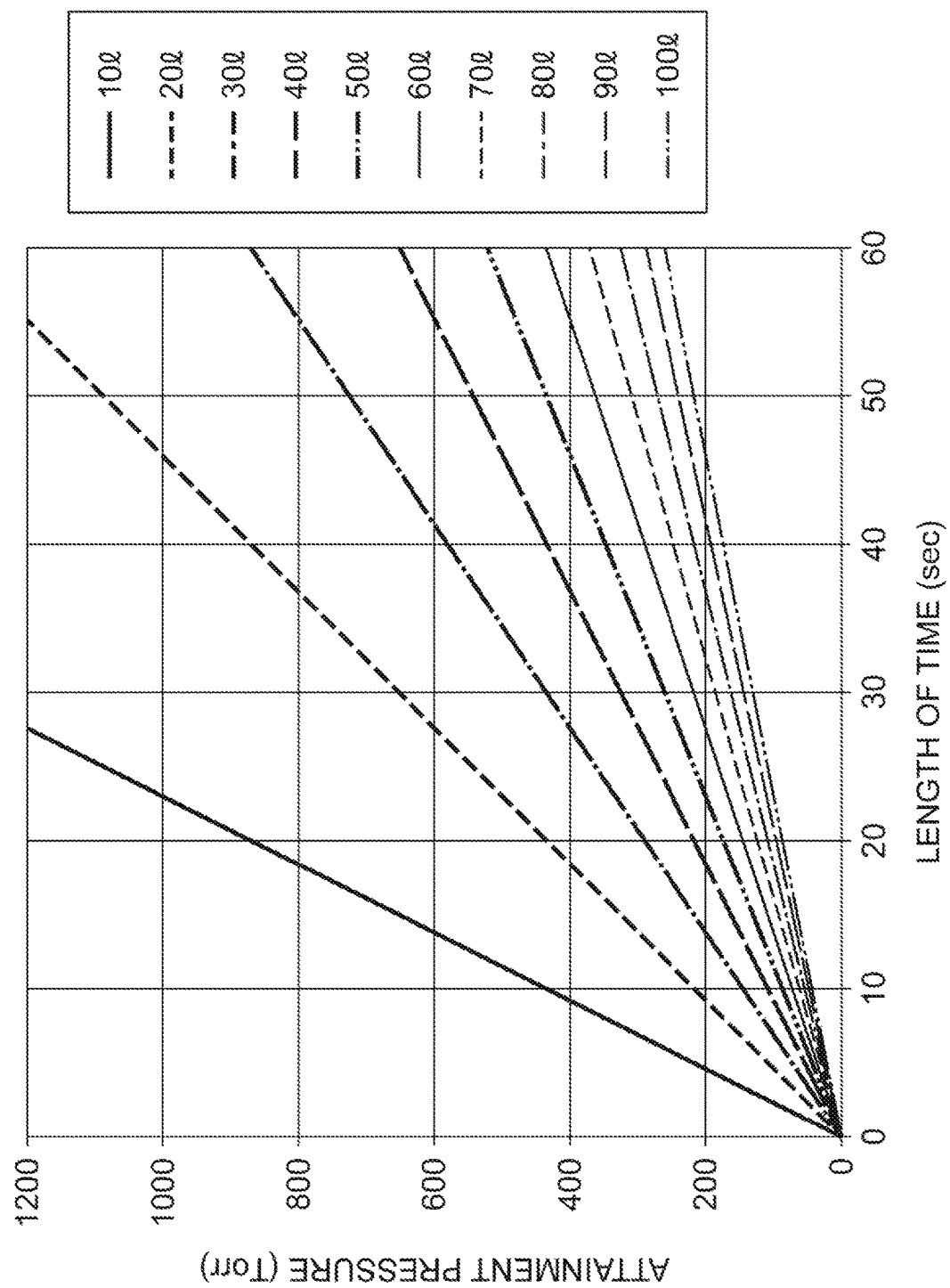
FIG. 5 is a graph illustrating results of a second simulation.

In a second simulation, the length of time for which gas having a flow rate of 30 slm is filled into the chamber and the attainment pressure of the chamber are determined using the volume of the chamber as parameters. FIG. 5 is a graph illustrating results of the second simulation. The horizontal axis of the graph of FIG. 5 is the length of time for which gas is filled, and the vertical axis is the attainment pressure of the chamber.

As shown in FIG. 4, regarding a chamber having a volume of 20 liters, even in a case where the length of time for which gas having the largest flow rate of 64,000 sccm among flow rates used in the first simulation is filled into the chamber is 20 seconds, the attainment pressure of the chamber is equal to or less than 1,000 Torr. In addition, as shown in FIG. 5, even in a case where the length of time for which gas having a flow rate of 30 slm is filled into a smallest chamber of 10 liters among the volumes of chambers used in the second simulation is 20 seconds, the attainment pressure of the chamber is equal to or less than 1,000 Torr. Therefore, in a case where a maximum pressure capable of being measured by the second pressure sensor is equal to or greater than 1,000 Torr (133,300 Pa), it has been confirmed that, even in a case where gas having a considerably large flow rate is supplied from a flow rate controller to a chamber having a considerably small volume, it is possible to secure a sufficiently long length of time as the length of time of a period during which the pressure of the chamber rises from an initial pressure to a final attainment pressure (target pressure), and to determine the output flow rate of the flow rate controller with a high degree of accuracy.

Hereinafter, a description will be given of relations which are preferably satisfied by a flow passage length Lb between one of the first pressure sensor 20 and the second pressure sensor 22 and the chamber 12c, and a flow passage length Ls between the other of the first pressure sensor 20 and the second pressure sensor 22 and the chamber 12c.

In a case where the pressure of the chamber 12c is in a range capable of being measured by the first pressure sensor 20, and is a range capable of being measured by the second pressure sensor 22, it is preferable that a measurement value P1 of the pressure of the chamber 12c in the first pressure sensor 20 and a measurement value P2 of the pressure of the chamber 12c in the second pressure sensor 22 are the same as each other. Therefore, the flow passage length Ls and the flow passage length Lb are ideally the same as each other.

Therefore, the flow passage length Lb and the flow passage length Ls cannot sometimes be made to be the same as each other, according to the situation of the layout of components of the substrate processing apparatus 10. In a case where there is a difference between the flow passage length Lb and the flow passage length Ls, a difference occurs in the conductance of a flow passage between the chamber 12c and the first pressure sensor 20, and the conductance of a flow passage between the chamber 12c and the second pressure sensor 22. Therefore, a difference occurs between the measurement value P1 and the measurement value P2. In the utilization of the method MT, in a case where the pressure of the chamber 12c is in a range capable of being measured by the first pressure sensor 20, and is in a range capable of being measured by the second pressure sensor 22, an allowable maximum value of a difference between the measurement value P1 and the measurement value P2 is 15 mTorr.

In an example of the substrate processing apparatus 10, when a flow passage length between the chamber 12c and the first pressure sensor 20 which is the flow passage length Lb is 220.4 mm, and a flow passage length between the chamber 12c and the second pressure sensor 22 which is the flow passage length Ls is 127.0 mm, a difference between the measurement value P1 and the measurement value P2 is 13 mTorr. This difference is an allowable difference in the utilization of the method MT.

From the above, the following Expression (4) is derived.

$$(220.4-127.0)/127.0:13=r:15 \quad (4)$$

In Expression (4), r is 0.8485. Lmax which is the maximum value of the flow passage length Lb is 234.8 mm from the following Expression (5).

$$(L\max-127.0)/127.0=0.8485 \quad (5)$$

In addition, the allowable minimum value of Ls/Lb is 0.54 from 127.0/234.8.

Therefore, in an embodiment, the flow passage length Lb and the flow passage length Ls are set so as to satisfy the relations of Lb≥Ls and 0.54≤Ls/Lb≤1. In addition, in an embodiment, the flow passage length Lb may be not more than 234.8 mm.

Hereinbefore, various embodiments have been described, but various modifications can be made without being limited to the above-described embodiments. For example, the volume of the chamber 12c used in the calculation of the output flow rate of the flow rate controller 14 in the method MT may not be determined by the process SP, and may be a numerical value which is known before the execution of the method MT.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of determining an output flow rate of gas which is output by a flow rate controller of a substrate processing apparatus, wherein the substrate processing apparatus includes:
    a chamber body providing a chamber;
    the flow rate controller configured to control an output flow rate of gas supplied to the chamber in accordance with a set flow rate to be specified;
    a pressure controller connected to the chamber;
    an exhaust apparatus connected to the chamber through the pressure controller;

a first pressure sensor configured to measure a pressure of the chamber; and a second pressure sensor configured to measure a pressure of the chamber, the second pressure sensor being capable of measuring a maximum pressure higher than a maximum pressure capable of being measured by the first pressure sensor, the method comprising:

selecting a pressure sensor from the first pressure sensor and the second pressure sensor in accordance with a set flow rate specified to the flow rate controller, wherein the first pressure sensor is selected in a case where the set flow rate is less than a threshold, and the second pressure sensor is selected in a case where the set flow rate is not less than the threshold;

determining a target pressure to be reached by the pressure of the chamber in accordance with the set flow rate;

starting to introduce gas at a flow rate according to the set flow rate from the flow rate controller to the chamber;

closing the pressure controller; and calculating an output flow rate of the flow rate controller, using a rate of rise of the pressure of the chamber with respect to a time which is derived from a measurement value of the pressure of the chamber measured by the selected pressure sensor, in a period from a time point at which the pressure controller was closed to a time point at which the pressure of the chamber reached the target pressure.

2. The method according to claim 1, wherein the target pressure is determined by referring to a table using the set flow rate, the table specifying in advance a relationship between flow rates and target pressures so that the period has a length of time not less than a predetermined length of time.

3. The method according to claim 1, further comprising determining a sampling interval so that a plurality of and a predetermined number of measurement values of the pressure of the chamber are obtained in the period, wherein the rate of rise of the pressure is derived from a plurality of measurement values of the pressure of the chamber measured by the selected pressure sensor at the sampling interval in the period.

4. The method according to claim 1, wherein a flow passage length $Lb$ between one of the first pressure sensor and the second pressure sensor and the chamber, and a flow passage length $Ls$ between the other of the first pressure sensor and the second pressure sensor and the chamber satisfy relations of $Lb \geq Ls$ and $0.54 \leq Ls/Lb \leq 1$.

5. The method according to claim 4, wherein the length $Lb$ is not more than 234.8 mm.

6. The method according to claim 1, wherein the maximum pressure capable of being measured by the second pressure sensor is not less than 133,300 Pa.

* * * * *